US008816768B2

(12) United States Patent
Tseng et al.

(10) Patent No.: US 8,816,768 B2
(45) Date of Patent: Aug. 26, 2014

(54) POWER MODULE FOR ENVELOPE TRACKING

(75) Inventors: Chun-Yen Tseng, Hsinchu (TW); Yen-Hsun Hsu, Hengshan Township, Hsinchu County (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 13/612,781

(22) Filed: Sep. 12, 2012

(65) Prior Publication Data

US 2013/0271225 A1 Oct. 17, 2013

Related U.S. Application Data

(60) Provisional application No. 61/623,167, filed on Apr. 12, 2012.

(51) Int. Cl.
*H03G 3/20* (2006.01)

(52) U.S. Cl.
USPC ............................ 330/136; 330/297; 330/127

(58) Field of Classification Search
USPC .......................................... 330/136, 297, 127
See application file for complete search history.

(56) References Cited

U.S. PATENT DOCUMENTS

| | | | | |
|---|---|---|---|---|
| 6,788,151 | B2 * | 9/2004 | Shvarts et al. | 330/297 |
| 6,914,487 | B1 * | 7/2005 | Doyle et al. | 330/297 |
| 7,207,054 | B1 * | 4/2007 | Richards et al. | 725/72 |
| 7,342,445 | B2 * | 3/2008 | Aridas et al. | 330/129 |
| 7,653,366 | B2 | 1/2010 | Grigore | |
| 8,030,995 | B2 * | 10/2011 | Okubo et al. | 330/127 |
| 8,237,503 | B2 * | 8/2012 | He et al. | 330/276 |
| 2011/0031953 | A1 | 2/2011 | Kanbe et al. | |

* cited by examiner

*Primary Examiner* — Patricia Nguyen

(74) *Attorney, Agent, or Firm* — McClure, Qualey & Rodack, LLP

(57) ABSTRACT

A power module for envelope tracking includes a linear amplifier and a DC-to-DC (Direct Current to Direct Current) converter. The linear amplifier has a positive input terminal for receiving a first control signal, a negative input terminal, and an output terminal for outputting a first adaptive supply voltage, wherein the output terminal is fed back to the negative input terminal. The DC-to-DC converter receives a second control signal, and supplies a second adaptive supply voltage to the linear amplifier according to the second control signal. The first control signal is related to the second control signal.

19 Claims, 4 Drawing Sheets

POWER MODULE FOR ENVELOPE TRACKING

CROSS REFERENCE TO RELATED APPLICATIONS

This application claims the benefit of U.S. Provisional Application No. 61/623,167, filed on Apr. 12, 2012, the entirety of which is incorporated by reference herein.

BACKGROUND OF THE INVENTION

1. Field of the Invention

The disclosure generally relates to a power module, and more particularly, relates to power module for envelope tracking (ET).

2. Description of the Related Art

A power amplifier (PA) is an important element in a communication system. Traditionally, the communication system supplies the power amplifier with a fixed supply voltage. The fixed supply voltage is much greater than a peak value of an output signal of the power amplifier such that some supply power is wasted.

Accordingly, there is a need to design a new power module for power management in a communication system so as to reduce power consumption of a power amplifier.

BRIEF SUMMARY OF THE INVENTION

In one exemplary embodiment, the disclosure is directed to a power module for supplying an adaptive supply voltage to a power amplifier generating an RF signal. The power module comprises a linear amplifier for supplying a first adaptive supply voltage to the power amplifier, and a DC-to-DC (Direct Current to Direct Current) converter, for supplying a second adaptive supply voltage to the linear amplifier.

In another exemplary embodiment, the disclosure is directed to a power module for envelope tracking, comprising: a linear amplifier, having a positive input terminal for receiving a first control signal, a negative input terminal, and an output terminal for outputting a first adaptive supply voltage, wherein the output terminal is fed back to the negative input terminal; and a DC-to-DC (Direct Current to Direct Current) converter, receiving a second control signal, and supplying a second adaptive supply voltage to the linear amplifier according to the second control signal, wherein the first control signal is related to the second control signal.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
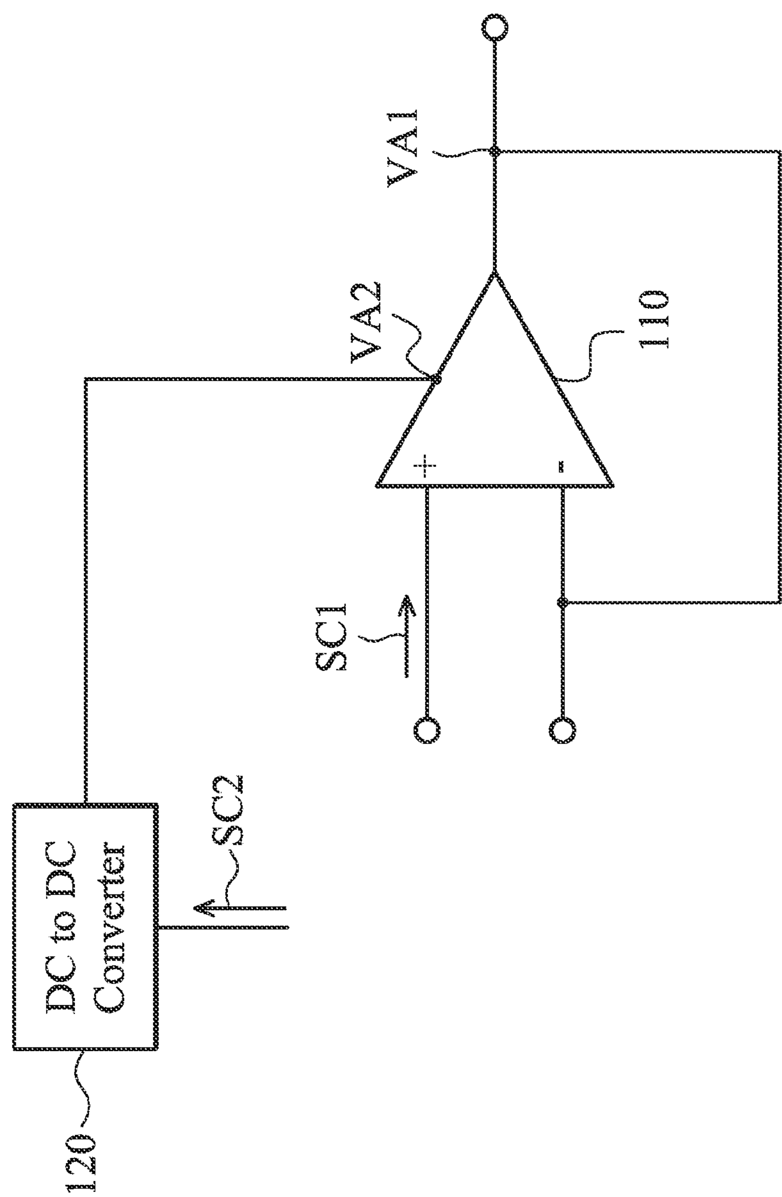
FIG. 1 is a diagram for illustrating a power module according to an embodiment of the invention.

FIG. 1 is a diagram for illustrating a power module 100 according to an embodiment of the invention. As shown in FIG. 1, the power module 100 at least comprises a linear amplifier 110 and a DC-to-DC (Direct Current to Direct Current) converter 120. The linear amplifier 110 has a positive input terminal for receiving a first control signal SC1, a negative input terminal, and an output terminal for outputting a first adaptive supply voltage VA1, wherein the output terminal is further fed back to the negative input terminal The linear amplifier 110 is configured to detect a voltage difference between the positive input terminal and the negative input terminal, and configured to amplify the voltage difference by a gain factor so as to output the first adaptive supply voltage VA1 at the output terminal. Since the gain factor is usually very large (ideally, infinite gain), the voltage at the positive input terminal is approximately equal to that at the negative input terminal The DC-to-DC converter 120 receives a second control signal SC2, and supplies a second adaptive supply voltage VA2 to the linear amplifier 110 according to the second control signal SC2. Note that the first control signal SC1 is related to the second control signal SC2. The first adaptive supply voltage VA1 and the second adaptive supply voltage VA2 will be described in detail in the following paragraph. In some embodiments, the waveform of the first control signal SC1 is similar to that of the second control signal SC2. In a preferred embodiment, the linear amplifier 110 can supply the first adaptive supply voltage VA1 to other electronic components, such as a power amplifier (PA), so as to perform envelope tracking and reduce power consumption.

Figure 2:
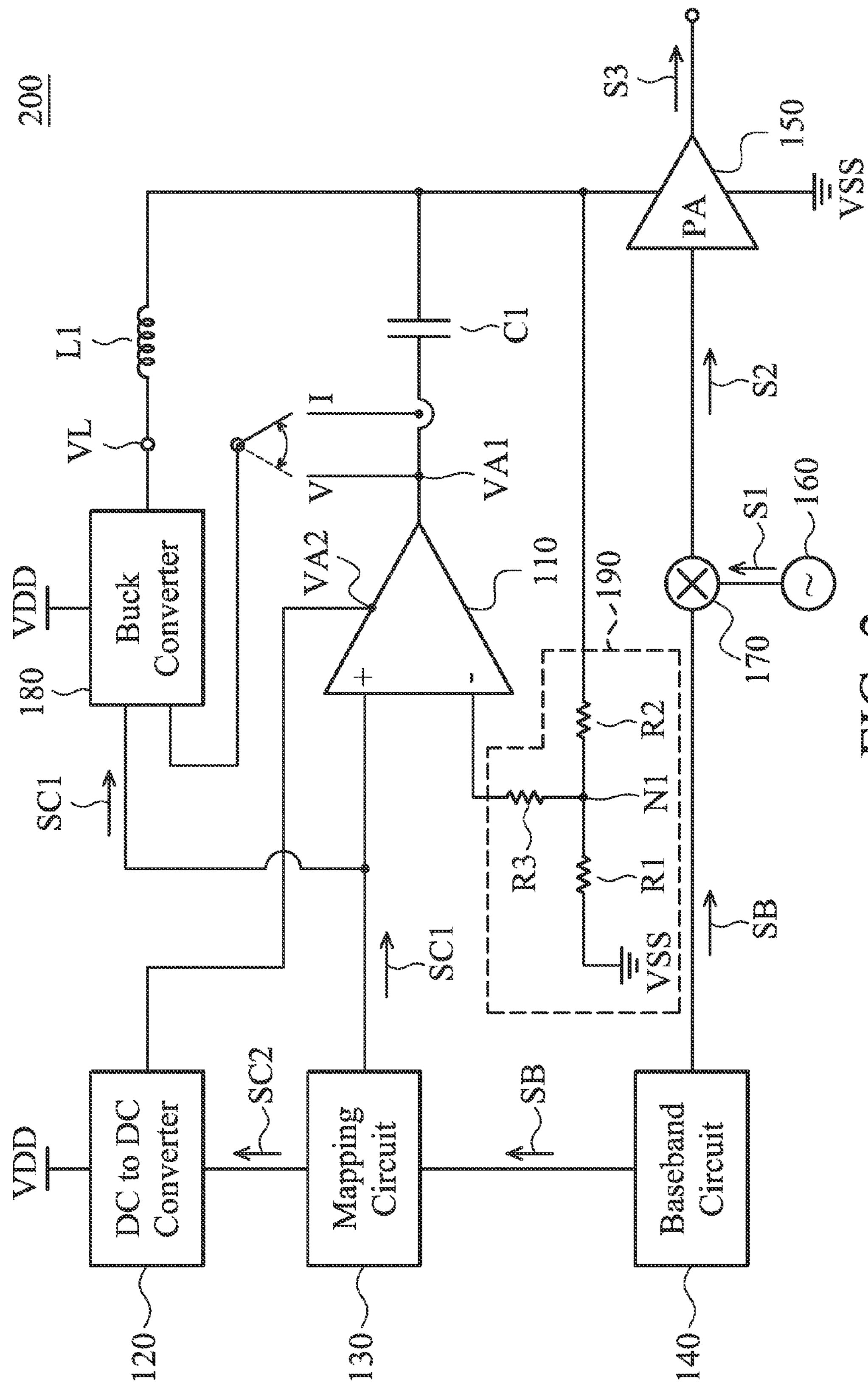
FIG. 2 is a diagram for illustrating a power module according to an embodiment of the invention.

FIG. 2 is a diagram for illustrating a power module 200 according to an embodiment of the invention. As shown in FIG. 2, the power module 200 may comprise the linear amplifier 110, the DC-to-DC converter 120, a mapping circuit 130, a baseband circuit 140, a power amplifier 150, a local oscillator 160, a mixer 170, a buck converter 180, a voltage divider circuit 190, an inductor L1, and a capacitor C1. Note that the invention is not limited to the above, and the power module 200 may further comprise other relative communication elements, such as filters and drivers.

The baseband circuit 140 generates a baseband signal SB, and transmits the baseband signal SB to the mapping circuit 130 and the mixer 170, respectively. The power amplifier 150 is coupled through the mixer 170 to the baseband circuit 140. The linear amplifier 110 supplies the first adaptive supply voltage VA1 to the power amplifier 150. The local oscillator 160 generates an oscillation signal 51. The mixer 170 generates a mixing signal S2 according to the baseband signal SB and the oscillation signal 51. The power amplifier 150 further amplifies the mixing signal S2 so as to output an RF (Radio Frequency) signal S3.

In a preferred embodiment, the mapping circuit 130 may be an ET (Envelope Tracking) mapping circuit. The mapping circuit 130 receives the baseband signal SB, and generates the first control signal SC1 and the second control signal SC2 according to the baseband signal SB. In some embodiments, at least two mapping tables are previously stored in the mapping circuit 130. The mapping circuit 130 maps the baseband signal SB to the first control signal SC1 by looking up a first mapping table, and maps the baseband signal SB to the second control signal SC2 by looking up a second mapping table. More particularly, the mapping circuit 130 obtains information of I/Q channel magnitude from the baseband signal SB, and uses the information to predict the first adaptive supply voltage VA1, which is going to be output by the linear amplifier 110, and the RF signal S3, which is going to be output by the power amplifier 150, and the mapping circuit 130 generates the first control signal SC1 and the second control signal SC2 according to the prediction. In a preferred embodiment, the second adaptive supply voltage VA2 substantially tracks the envelope of the first adaptive supply voltage VA1, and the first adaptive supply voltage VA1 substantially tracks the envelope of the RF signal S3, thereby reducing power consumption of the linear amplifier 110 and the power amplifier 150.

The output terminal of the linear amplifier 110 may be fed back through the voltage divider circuit 190 to the negative input terminal of the linear amplifier 110. In some embodiments, the voltage divider circuit 190 comprises a first resistor R1, a second resistor R2, and a third resistor R3. The first resistor R1 is coupled between a ground voltage VSS (e.g., 0V) and a node N1. The second resistor R2 is coupled between the node N1 and the output terminal of the linear amplifier 110. The third resistor R3 is coupled between the node N1 and the negative input terminal of the linear amplifier 110. Note that the voltage divider circuit 190 is an optional element and may be removed from the power module 200 in other embodiments.

The buck converter 180 is coupled to a work voltage VDD. The buck converter 180 has a first input terminal for receiving the first control signal SC1, a second input terminal for reading a voltage V or a current I at the output terminal of the linear amplifier 120, and a buck output terminal coupled to the power amplifier 150. In some embodiments, the buck converter 180 converts the work voltage VDD into a low voltage VL at the buck output terminal according to the received signals at the first input terminal and the second input terminal. In addition, the inductor L1 may be coupled between the buck output terminal and the power amplifier 150 so as to block AC (Alternating Current) components, and the capacitor C1 may be coupled between the output terminal of the linear amplifier 110 and the power amplifier 150 so as to block DC (Direct Current) components. Generally speaking, the buck converter 180 supplies DC components to the power amplifier 150, and the linear amplifier 110 supplies AC components to the power amplifier 150. The buck converter 180 can help improve heat dissipation in the linear amplifier 110. Note that the buck converter 180, the inductor L1 and the capacitor C1 are optional elements, and they may be removed from the power module 200 in other embodiments.

Figure 3:
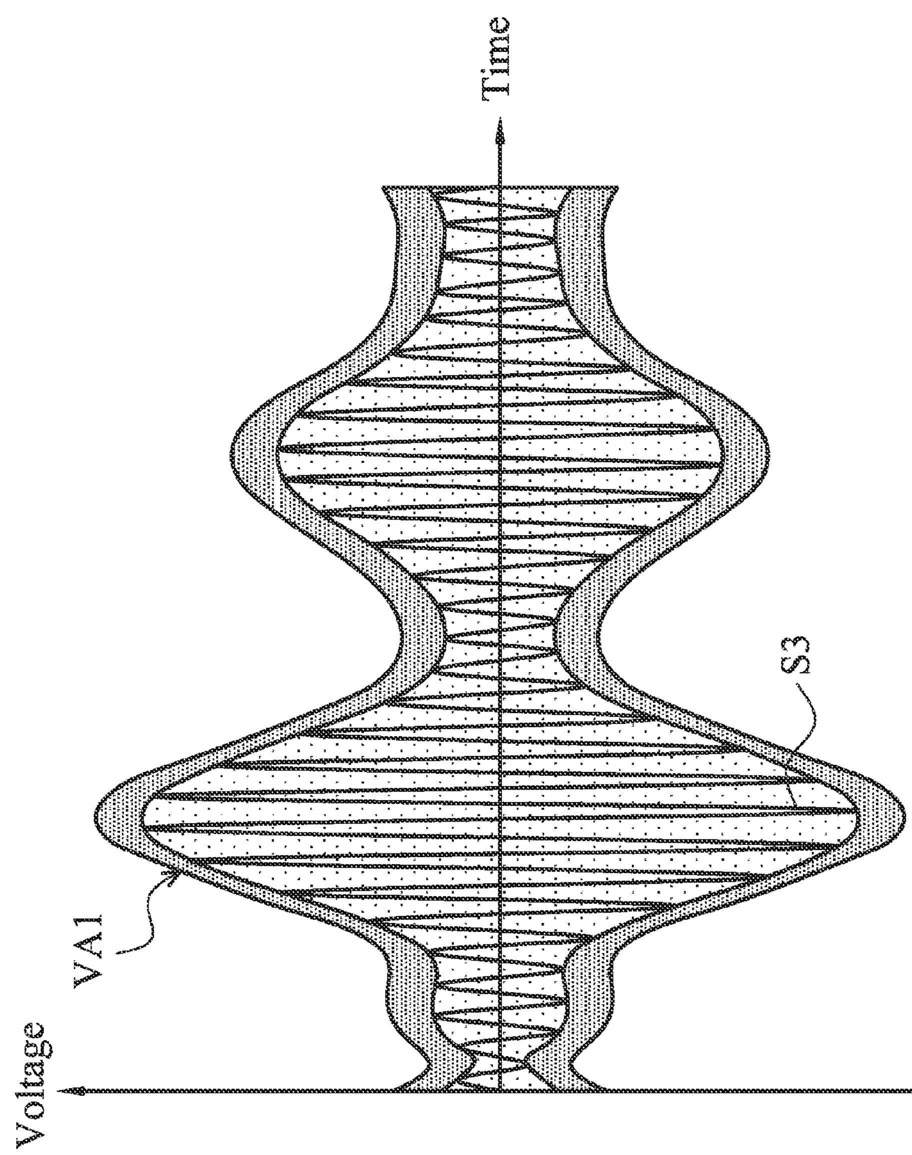
FIG. 3 is a diagram for illustrating a waveform of a first adaptive supply voltage and a waveform of an RF (Radio Frequency) signal according to an embodiment of the invention.

FIG. 3 is a diagram for illustrating the waveform of the first adaptive supply voltage VA1 and the waveform of the RF signal S3 according to an embodiment of the invention. The horizontal axis represents time, and the vertical axis represents amplitude (unit: voltage). As shown in FIG. 3, the first adaptive supply voltage VA1 substantially tracks the envelope of the RF signal S3, and the voltage difference between the first adaptive supply voltage VA1 and the RF signal S3 becomes small. Therefore, the power consumption of the power amplifier 150 can be effectively reduced. Similarly, the second adaptive supply voltage VA2 substantially tracks the envelope of the first adaptive supply voltage VA1, thereby reducing the power consumption of the linear amplifier 110. There are three methods for envelope tracking in the invention. These methods will be illustrated as follows.

Figure 4A:
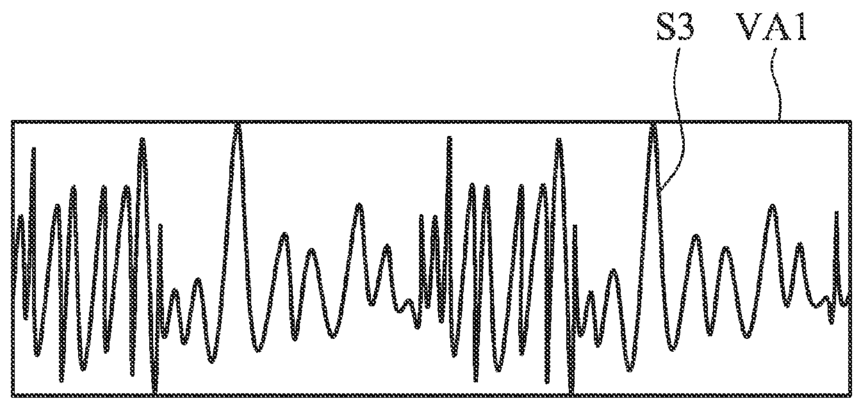
FIG. 4A is a diagram for illustrating a first method for envelope tracking according to an embodiment of the invention.

FIG. 4A is a diagram for illustrating a first method for envelope tracking according to an embodiment of the invention. As shown in FIG. 4A, the RF signal S3 has a complex waveform, but the first adaptive supply voltage VA1 just has a fixed voltage level which is greater than or equal to the peak value of the RF signal S3. The first method is the simplest method for reducing wasted power consumption in the power module. The first method just requires a simple circuit.

Figure 4B:
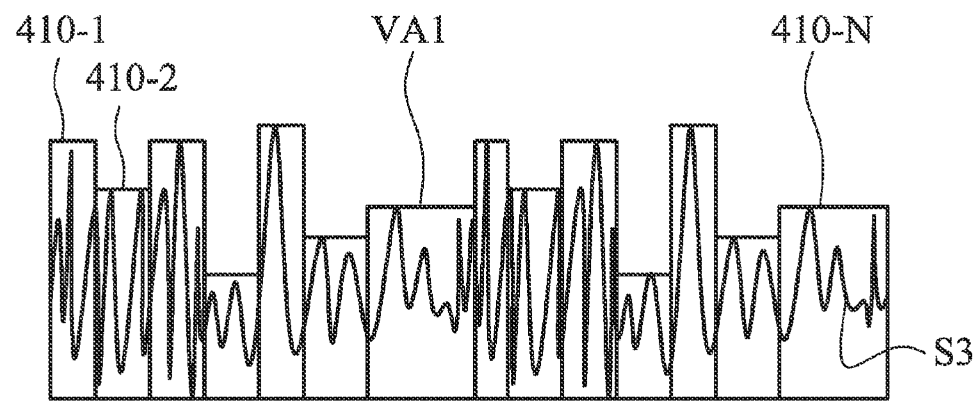
FIG. 4B is a diagram for illustrating a second method for envelope tracking according to an embodiment of the invention.

FIG. 4B is a diagram for illustrating a second method for envelope tracking according to an embodiment of the invention. As shown in FIG. 4B, the waveform of the first adaptive supply voltage VA1 comprises a plurality of dynamic slot windows 410-1, 410-2, . . . , and 410-N, and a combination of the dynamic slot windows 410-1, 410-2, . . . , and 410-N forms a shape which is similar to the envelope of the RF signal S3. In the embodiment, the first adaptive supply voltage VA1 roughly tracks the envelope of the RF signal S3 dynamically. The second method requires a more complex circuit than the first method does.

Figure 4C:
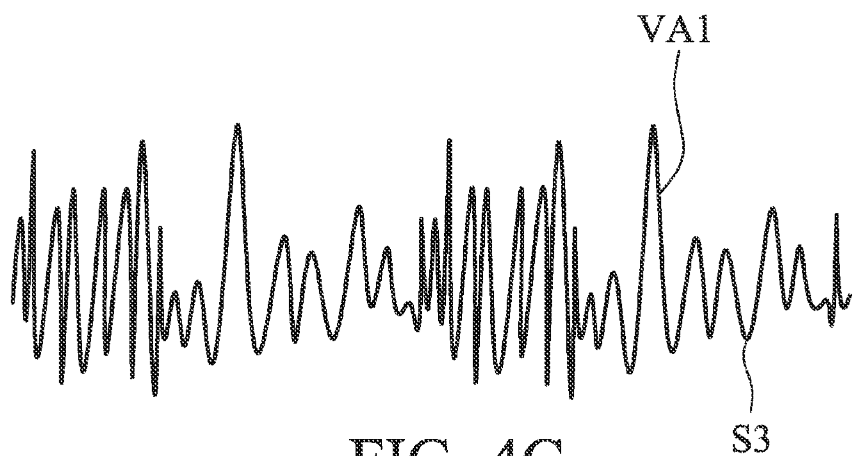
FIG. 4C is a diagram for illustrating a third method for envelope tracking according to an embodiment of the invention.

FIG. 4C is a diagram for illustrating a third method for envelope tracking according to an embodiment of the invention. As shown in FIG. 4C, the first adaptive supply voltage VA1 reconstructs the envelope of the RF signal S3 completely. In the embodiment, the first adaptive supply voltage VA1 and the RF signal S3 have identical waveforms. The third method is the most effective method for saving power in the power module. The third method requires the most complex circuit among the three methods.

In addition, the relationship between the first adaptive supply voltage VA1 and the RF signal S3 may be similar to the relationship between the second adaptive supply voltage VA2 and the first adaptive supply voltage VA 1. In other words, the first adaptive supply voltage VA1 and the RF signal S3 as shown in FIGS. 4A-4C may be replaced with the second adaptive supply voltage VA2 and the first adaptive supply voltage VA1, respectively. The second adaptive supply voltage VA2 may also tracks the envelope of the first adaptive supply voltage VA1 according to the above three methods.

Note that the three methods for envelope tracking as described in FIGS. 4A-4C may be all performed by the power modules 100 and 200. The power modules 100 and 200 may predict the output of the power amplifier 150 and accordingly generate the first adaptive supply voltage VA1 and the second adaptive supply voltage VA2 as mentioned above.

In a preferred embodiment, the DC-to-DC converter 120 is an adaptive voltage generator (AVG). The DC-to-DC converter 120 may be implemented by an inductor-base switching converter or a capacitor-base switching converter.

The power module of the invention can supply adaptive supply voltages to the linear amplifier and the power amplifier according to the baseband signal, thereby reducing power consumption of the whole system effectively. In particular to modern 3G/4 G communication systems, the AC supply voltage dominates the efficiency of the power amplifier. The linear amplifier is incorporated into the invention so as to control the AC supply voltage appropriately.

Use of ordinal terms such as “first”, “second”, “third”, etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A power module for supplying an adaptive supply voltage to a power amplifier generating an RF (Radio Frequency) signal, comprising:

a linear amplifier, for supplying a first adaptive supply voltage to the power amplifier;

a DC-to-DC (Direct Current to Direct Current) converter, for supplying a second adaptive supply voltage to the linear amplifier; and a mapping circuit, for controlling the linear amplifier and the DC-to-DC converter according to a baseband signal.

2. The power module as claimed in claim 1, wherein the second adaptive supply voltage substantially tracks an envelope of the first adaptive supply voltage.

3. The power module as claimed in claim 1, wherein the first adaptive supply voltage substantially tracks an envelope of the RF signal.

4. The power module as claimed in claim 1, wherein a waveform of the first adaptive supply voltage comprises a plurality of dynamic slot windows, and a combination of the dynamic slot windows forms a shape which is similar to the envelope of the RF signal.

5. The power module as claimed in claim 1, wherein the first adaptive supply voltage reconstructs the envelope of the RF signal.

6. The power module as claimed in claim 1, wherein a waveform of the second adaptive supply voltage comprises a plurality of dynamic slot windows, and a combination of the dynamic slot windows forms a shape which is similar to the envelope of the first adaptive supply voltage.

7. The power module as claimed in claim 1, wherein the second adaptive supply voltage reconstructs the envelope of the first adaptive supply voltage.

8. The power module as claimed in claim 1, wherein the mapping circuit obtains information of I/Q channel magnitude from the baseband signal.

9. The power module as claimed in claim 1, further comprising:

a buck converter, coupled to a work voltage, wherein the buck converter has a first input terminal for receiving a control signal from the mapping circuit, a second input terminal for reading a voltage or a current at an output terminal of the linear amplifier, and a buck output terminal coupled to the power amplifier, wherein the control signal is generated by the mapping circuit according to the baseband signal.

10. The power module as claimed in claim 9, further comprising:

an inductor, coupled between the buck output terminal and the power amplifier; and a capacitor, coupled between the output terminal of the linear amplifier and the power amplifier.

11. A power module for supplying an adaptive supply voltage to a power amplifier generating an RF (Radio Frequency) signal, comprising:

a linear amplifier, for supplying a first adaptive supply voltage to the power amplifier;

a DC-to-DC (Direct Current to Direct Current) converter, for supplying a second adaptive supply voltage to the linear amplifier; and a voltage divider circuit, wherein an output terminal of the linear amplifier is fed back through the voltage divider circuit to a negative input terminal of the linear amplifier.

12. The power module as claimed in claim 11, wherein the voltage divider circuit comprises:

a first resistor, coupled between a ground voltage and a node;

a second resistor, coupled between the output terminal of the linear amplifier and the node; and a third resistor, coupled between the node and the negative input terminal of the linear amplifier.

13. The power module as claimed in claim 1, wherein the DC-to-DC converter is an adaptive voltage generator.

14. The power module as claimed in claim 13, wherein the DC-to-DC converter is implemented by an inductor-base switching converter.

15. The power module as claimed in claim 13, wherein the DC-to-DC converter is implemented by a capacitor-base switching converter.

16. A power module, comprising:

a linear amplifier, having a positive input terminal for receiving a first control signal, a negative input terminal, and an output terminal for outputting a first adaptive supply voltage, wherein the output terminal is fed back to the negative input terminal; and a DC-to-DC (Direct Current to Direct Current) converter, receiving a second control signal, and supplying a second adaptive supply voltage to the linear amplifier, wherein the first control signal is related to the second control signal.

17. The power module as claimed in claim 16, wherein the first and second control signals are related to a baseband signal.

18. The power module as claimed in claim 16, wherein the second adaptive supply voltage substantially tracks an envelope of the first adaptive supply voltage.

19. The power module as claimed in claim 16, wherein the linear amplifier supplies the first adaptive supply voltage to a power amplifier generating an RF (Radio Frequency) signal, a waveform of the first adaptive supply voltage comprises a plurality of dynamic slot windows, a combination of the dynamic slot windows forms a shape which is similar to an envelope of the RF signal, and a waveform of the second adaptive supply voltage comprises a plurality of dynamic slot windows, and a combination of the dynamic slot windows forms a shape which is similar to an envelope of the first adaptive supply voltage.

* * * * *